(12) United States Patent
Imamura et al.

(10) Patent No.: US 8,638,154 B2
(45) Date of Patent: Jan. 28, 2014

(54) SYSTEM CLOCK MONITORING APPARATUS AND MOTOR CONTROL SYSTEM

(75) Inventors: Katsuyuki Imamura, Osaka (JP); Kosei Fujisaka, Kyoto (JP)

(73) Assignee: Panasonic Corporation, Osaka (JP)

( * ) Notice: Subject to any disclaimer, the term of this patent is extended or adjusted under 35 U.S.C. 154(b) by 150 days.

(21) Appl. No.: 13/153,014

(22) Filed: Jun. 3, 2011

(65) Prior Publication Data
US 2011/0234137 A1 Sep. 29, 2011

Related U.S. Application Data

(63) Continuation of application No. PCT/JP2009/005155, filed on Oct. 5, 2009.

(30) Foreign Application Priority Data

Dec. 8, 2008 (JP) ................... 2008-312231

(51) Int. Cl.
*H03K 5/22* (2006.01)
*H03L 7/00* (2006.01)

(52) U.S. Cl.
USPC .............. 327/292; 327/291; 327/42; 318/807

(58) Field of Classification Search
USPC ............. 318/700, 400.01, 807; 327/291, 292, 327/42; 713/600; 331/33
See application file for complete search history.

(56) References Cited

U.S. PATENT DOCUMENTS

| 5,167,031 A | 11/1992 | Watanabe |
| 5,517,095 A * | 5/1996 | Carobolante et al. .... 318/400.35 |
| 5,694,380 A * | 12/1997 | Shimizume et al. ....... 369/47.45 |
| 5,852,728 A | 12/1998 | Matsuda et al. |
| 5,969,558 A | 10/1999 | Abe |
| 6,084,364 A * | 7/2000 | Menegoli ................ 318/400.11 |
| 6,128,433 A * | 10/2000 | Gable et al. .................. 386/202 |
| 6,269,061 B1 * | 7/2001 | Shimizume et al. ......... 369/47.3 |
| 6,333,646 B1 * | 12/2001 | Tsuzuki ......................... 327/47 |
| 6,516,422 B1 | 2/2003 | Doblar et al. |
| 8,005,636 B2 * | 8/2011 | Shipton et al. ............... 702/106 |

FOREIGN PATENT DOCUMENTS

| JP | 03-062611 | 3/1991 |
| JP | 04-326410 | 11/1992 |
| JP | 05-233091 | 9/1993 |
| JP | 10-124167 A | 5/1998 |
| JP | 2000-112756 | 4/2000 |
| JP | 2002-366252 | 12/2002 |

OTHER PUBLICATIONS

Japanese Office Action issued in Japanese Patent Application No. 2010-541965 dated Sep. 18, 2012.

* cited by examiner

*Primary Examiner* — Eduardo Colon Santana
(74) *Attorney, Agent, or Firm* — McDermott Will & Emery LLP (57) ABSTRACT

A mode determination circuit is configured to determine whether there is a status change of the electric system associated with a frequency variation of a system control clock, and a clock change circuit is configured to change the system control clock from a system clock to a monitoring clock based on a determination result obtained by the mode determination circuit.

9 Claims, 8 Drawing Sheets

SYSTEM CLOCK MONITORING APPARATUS AND MOTOR CONTROL SYSTEM

CROSS REFERENCE TO RELATED APPLICATIONS

This application is continuation of PCT International Application No. PCT/JP2009/005155, filed on Oct. 5, 2009, which in turn claims the benefit of Japanese Application No. 2008-312231, filed on Dec. 8, 2008, the disclosures of which Applications are incorporated by reference herein.

TECHNICAL FIELD TO WHICH THE INVENTION PERTAINS

The present invention relates to a system clock monitoring apparatus loaded in an electric system driven by a system control clock based on a system clock, the system clock monitoring apparatus being configured to monitor a frequency abnormality of the system clock using a clock supplied from a source different to the system clock as a monitoring clock. The present invention further relates to a motor control system loaded with such a system clock monitoring apparatus, and more particularly to a technology for improving the product safety of an information processing apparatus such as a semiconductor integrated circuit.

RELATED PRIOR ART

The entire documents of Japanese patent application No. 2008-312231 filed on Dec. 8, 2008, which include the specification, drawings, and scope of claims, are incorporated herein by reference.

A known conventional system clock monitoring apparatus is technically characterized in that a monitoring clock supplied from a different source is arranged apart from a system clock used to drive an electric system, and number of pulses of the system clock is counted within a time frame defined by the monitoring clock and compared to an expected value (number of pulses in a normal operation) to evaluate whether the system clock is undergoing any frequency abnormality. An example of the system clock monitoring apparatus is disclosed in the Patent Document 1.

[Prior Art Document]
[Patent Document]
  Patent Document 1: Unexamined Japanese Patent Applications Laid-Open No. 04-326410

SUMMARY OF THE INVENTION

Problem to be Solved by the Invention

The conventional system clock monitoring apparatus can detect whether there is an ongoing frequency abnormality by monitoring a frequency variation of the system clock unexpected in an electric system. The conventional system clock monitoring apparatus is, however, inconvenient whenever the frequency of the system clock is intentionally changed in, for example, an operation mode change or transition to a low power consumption mode because the intended change is similarly evaluated as the frequency abnormality. Such an intentional change of the system clock frequency should not be detected as an abnormal event, nevertheless, oscillation of the monitoring clock has to be temporarily suspended once the abnormality is detected. In the case where the monitoring clock oscillation has to be suspended during the clock setting or mode change, the safety of an electric system is no longer ensured because whether the clock frequency is abnormal cannot be checked during the suspension.

Therefore, a main object of the present invention is to be able to change a clock frequency while ensuring the safety of an electric system.

Means for Solving Problems

A system clock monitoring apparatus according to the present invention is a system clock monitoring apparatus loaded in an electric system driven by a system control clock based on a system clock, the system clock monitoring apparatus being configured to monitor a frequency abnormality of the system clock using a monitoring clock supplied from a source different to the system clock, comprising:
  a mode determination circuit configured to determine whether there is a status change of the electric system associated with a frequency variation of the system control clock; and
  a clock change circuit configured to change the system control clock from the system clock to the monitoring clock based on a determination result obtained by the mode determination circuit.

For the clock setting or mode change associated with the frequency variation of the system control clock, the mode determination circuit makes the clock change circuit change the system control clock from the system clock currently selected to the frequency-stable monitoring clock of a different source. In doing so, it is unnecessary to suspend oscillation of the monitoring clock, reasons of which will be described below.

First, the frequency change of the system control clock in the event of the clock setting or mode change does not result from an unexpected frequency variation but results from an intentional frequency variation, making it unnecessary to suspend oscillation of the monitoring clock.

Second, the frequency variation of the system control clock does not undermine the stability of the electric system because the frequency-variable system clock so far used as the system control clock is replaced with the frequency-stable monitoring clock. Though the frequency of the system clock may be changed, the frequency of the monitoring clock, which is a different clock to the system clock, stays constant. When the monitoring clock having a stably constant frequency is used as the system control clock to drive the electric system, an operation rate may more or less slows down, however, the operation of the electric system per se is not thereby adversely affected, and the stability of the electric system can be ensured.

At the time of any intentional frequency change of the system clock for the clock setting or mode change in, for example, an operation mode change or transition to a low power consumption mode, the system control clock is changed from the frequency-variable system clock to the frequency-constant monitoring clock supplied from a different source. Therefore, it is unnecessary to suspend oscillation of the monitoring clock to change the clock frequency. Thus, the clock frequency can be changed with a good stability ensured in the electric system.

According to a preferable mode of the system clock monitoring apparatus of the present invention, the mode determination circuit makes the clock change circuit change the system control clock from the system clock to the monitoring clock when the status change is detected and then suspends the system clock monitoring operation by the system clock monitoring apparatus during a period from a start timing of the status change to an end timing of the status change, and the mode determination circuit makes the clock change circuit change the system control clock from the monitoring clock to the frequency-changed system clock when the end timing arrives and then restarts the system clock monitoring operation.

According to the system clock monitoring apparatus thus technically characterized, the system clock monitoring operation, which includes counting of a pulse number of the system clock and comparison of the pulse count to an expected value, is suspended during a short period from the status change start timing to the status change end timing. During the suspension of the system clock monitoring operation, the electric system is driven by the monitoring clock having a stably constant frequency used as the system control clock. When the frequency of the system clock is stabilized after the suspension period of the system clock monitoring is over, the system control clock is changed to the frequency-changed system clock to restart the system clock monitoring operation. Thus technically arranged, the system clock can be appropriately and accurately monitored. When the system clock is intentionally changed, the system clock monitoring operation can be carried out as originally planned without any malfunction.

When oscillation of the system clock is accidentally ceased during the suspension period of the system clock monitoring operation, the electric system normally continues its operation because the monitoring clock different to the system clock is used as the system control clock. When the suspension period of the system clock monitoring operation is over, the system control clock is changed back to the system clock to restart the system clock monitoring operation. Then, the system clock monitoring operation detects an abnormality because oscillation of the system clock selected as the system control clock is currently halted. Thus, the system clock unexpectedly halted can still be detected as an abnormality, and an abnormality detection signal outputted then can be used to lead the electric system to a safe condition.

According to another preferable mode of the system clock monitoring apparatus of the present invention, the clock change circuit is under such a synchronous control that any system control clock having a cycle shorter than one of cycles of the system clock and the monitoring clock shorter than the other is not generated when the system control clock is changed to and from the system clock and the monitoring clock.

More specifically, the clock change circuit under the synchronous control preferably starts to change the system control clock in a pre-clock change interval H and starts to output the changed clock in a post-clock change interval H.

According to the system clock monitoring apparatus thus technically characterized, the cycle of the clock selected as the system control clock is never shorter than one of the cycles of the system clock and the monitoring clock shorter than the other. As a result, occurrence of a noise pulse is very unlikely, stabilizing the operation of the electric system in which the system control clock is used.

According still another mode of the present invention, the system clock monitoring apparatus further comprises:
 a self-contained oscillator circuit configured to generate the monitoring clock; and
 a frequency corrector circuit configured to control a frequency of the monitoring clock generated by the self-contained oscillator circuit.

According to the system clock monitoring apparatus thus technically characterized, any impact possibly generated by external noise can be reduced because the oscillator circuit which generates and outputs the monitoring clock is provided in the system, and the function of the frequency corrector circuit counteracts any frequency errors of the monitoring clock resulting from the manufacturing variability. As a result, the monitoring clock is better stabilized.

The frequency corrector circuit preferably makes the self-contained oscillator circuit output the monitoring clock having a frequency equal to the frequency of the system clock when the clock change circuit is currently selecting the monitoring clock.

The system clock monitoring apparatus thus technically characterized, wherein the monitoring clock having the same frequency as that of the system clock is always outputted during the clock change, is capable of controlling the system without making a user be aware of the frequency of the monitoring clock. The monitoring clock having the same frequency as the frequency of the system clock currently changing is selected as the system control clock, and the system control clock thus selected is used to drive the electric system. This technical characteristic enables the electric system to be driven with a good responsiveness to the frequency change of the system clock.

The clock change circuit is preferably configured to change the system control clock to and from the system clock and the monitoring clock using software.

A motor control system according to the present invention comprises:
 a motor;
 an inverter apparatus configured to control number of rotations of the motor based on a system control clock based on a system clock; and
 a microcomputer for inverter control configured to control the inverter apparatus, wherein
 the microcomputer for inverter control has the system clock monitoring apparatus according to the present invention configured to monitor the frequency abnormality of the system clock using the monitoring clock supplied from the source different to the system clock, so that the motor is led to a safe condition by monitoring the frequency abnormality of the system clock in the system clock monitoring apparatus.

Effect of the Invention

At the time of any intentional frequency change of the system clock for the clock setting or mode change in, for example, an operation mode change or transition to a low power consumption mode, the system control clock is changed from the frequency-variable system clock to the frequency-constant monitoring clock of a different source. Therefore, it is unnecessary to suspend oscillation of the monitoring clock to change the clock frequency. Thus, the clock frequency can be changed with a good safety ensured in the electric system.

EXEMPLARY EMBODIMENTS OF THE INVENTION

Figure 1:
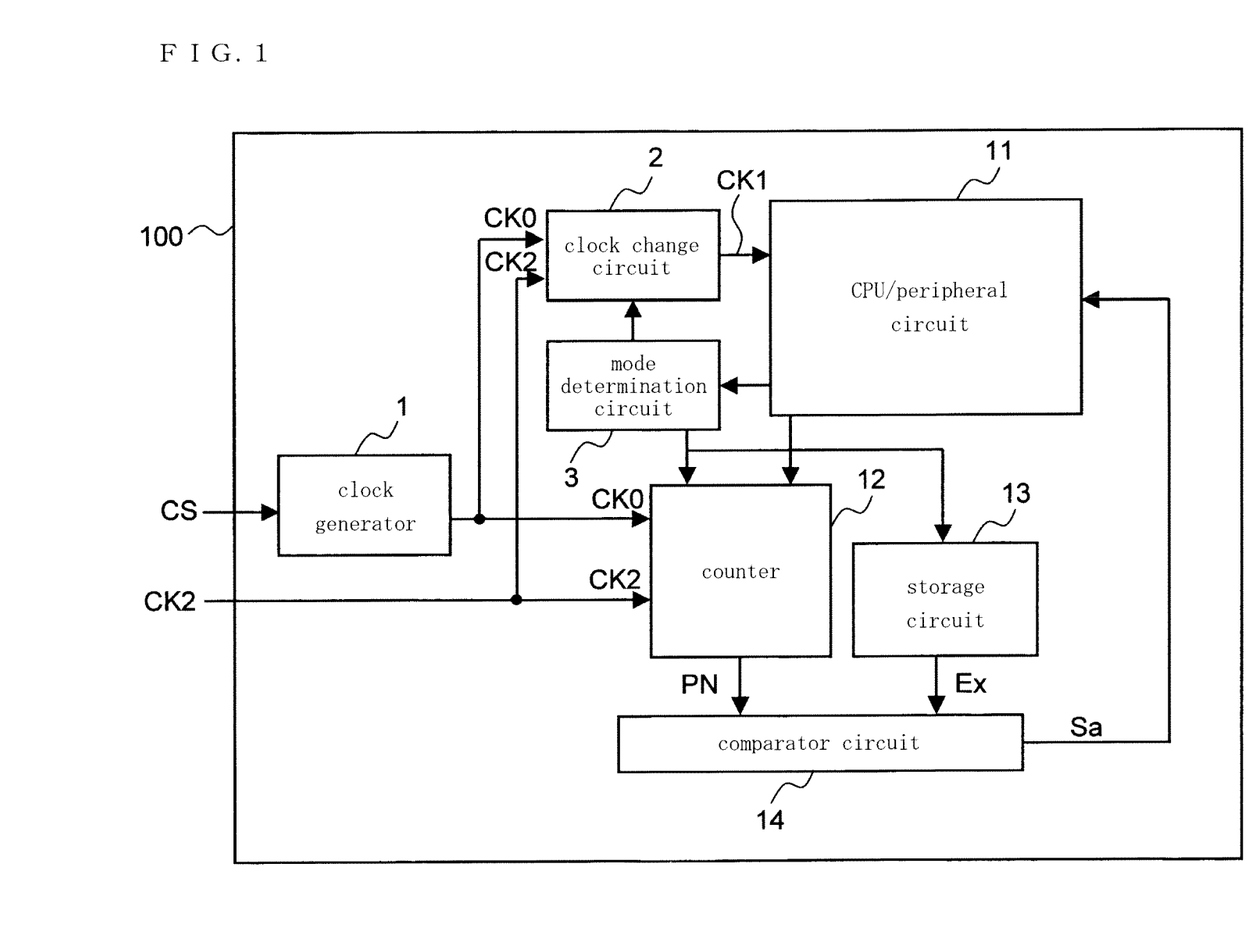
FIG. 1 is a block diagram illustrating a system clock monitoring apparatus according to an exemplary embodiment 1 of the present invention.

FIG. 1 is a block diagram of an electric system 100 loaded with a system clock monitoring apparatus according to an exemplary embodiment 1 of the present invention. The system clock monitoring apparatus provided in the electric system 100 according to the present exemplary embodiment has a clock generator 1, a clock change circuit 2, a mode determination circuit 3, a CPU/peripheral circuit 11, a counter 12, a storage circuit 13, and a comparator circuit 14.

A system clock CK0 and a monitoring clock CK2 are inputted to the counter 12. The counter 12 counts a pulse number PN of the system clock CK0 within a given time frame defined by the monitoring clock CK2. The storage circuit 13 stores therein an expected value Ex of the pulse number PN. The comparator circuit 14 compares the pulse number PN of the system clock CK0 counted by the counter 12 to the expected value Ex stored in the storage circuit 13. In the case where the pulse number PN is not equal to the expected value Ex, the comparator circuit 14 activates an abnormality detection signal Sa and outputs the activated abnormality detection signal Sa to the CPU/peripheral circuit 11. The clock generator 1 generates the system clock CK0 based on a system clock source CS supplied thereto, and outputs the generated system clock CK0 to the counter 12 and the clock change circuit 2. The clock generator 1 is configured such that a user can arbitrarily set the frequency of the system clock CK0 generated from the system clock source CS.

The system clock CK0 from the clock generator 1 and the monitoring clock CK2 from a source different to the system clock source CS are inputted to the clock change circuit 2. The clock change circuit 2 is controlled by the mode determination circuit 3 to select one of the system clock CK0 and the monitoring clock CK, and outputs the selected clock to the CPU/peripheral circuit 11 as a system control clock CK1.

The mode determination circuit 3 has the following functions.

making the clock change circuit 2 change the system control clock CK1 from the frequency-variable system clock CK0 to the frequency-stable monitoring clock CK2 when the clock setting or mode change handled by the CPU/peripheral circuit 11 is detected;

making the counter 12 and the comparator circuit 14 respectively suspend the system clock monitoring operation including counting of the pulse number of the system clock CK0 and comparison of the pulse count to the expected value; and making the storage circuit 13 update the expected value Ex to an expected value after the clock setting or mode change.

The mode determination circuit 3 determines whether the CPU/peripheral circuit 11 is currently performing the clock or mode change, and outputs a determination result thereby obtained to the clock change circuit 2. Further, the mode determination circuit 3 determines a current setting status of the clock or mode, and outputs a determination result thereby obtained to the storage circuit 13. The storage circuit 13 is configured to change the expected value Ex to an expected value responsive to the output of the mode determination circuit 3.

The clock change circuit 2 always starts to change the clock in a pre-change clock interval H and starts to output the changed clock in a post-change clock interval H regardless of whether the system clock CK0 and the monitoring clock CK2 have different frequencies, thus enabling the system control clock to be synchronously adjusted. The system control clock CK1 synchronized and then outputted from the clock change circuit 2 has a clock cycle equal to or longer than one of cycles of the system clock CK0 and the monitoring clock CK2 having a longer pulse cycle than the other. Therefore, one of the system clock CK0 and the monitoring clock CK2 having a pulse cycle shorter than the other is never outputted as the system control clock CK1.

Describing the structural characteristics of the CPU/peripheral circuit 11 and the counter 12, the CPU/peripheral circuit 11 is configured to operate using the system control clock CK1 selected by the clock change circuit 2 as a clock source, and the counter 12 is controlled by the CPU/peripheral circuit 11 or the mode determination circuit 3 to turn on or turn off a system clock monitoring operation (counting operation).

Figure 2:
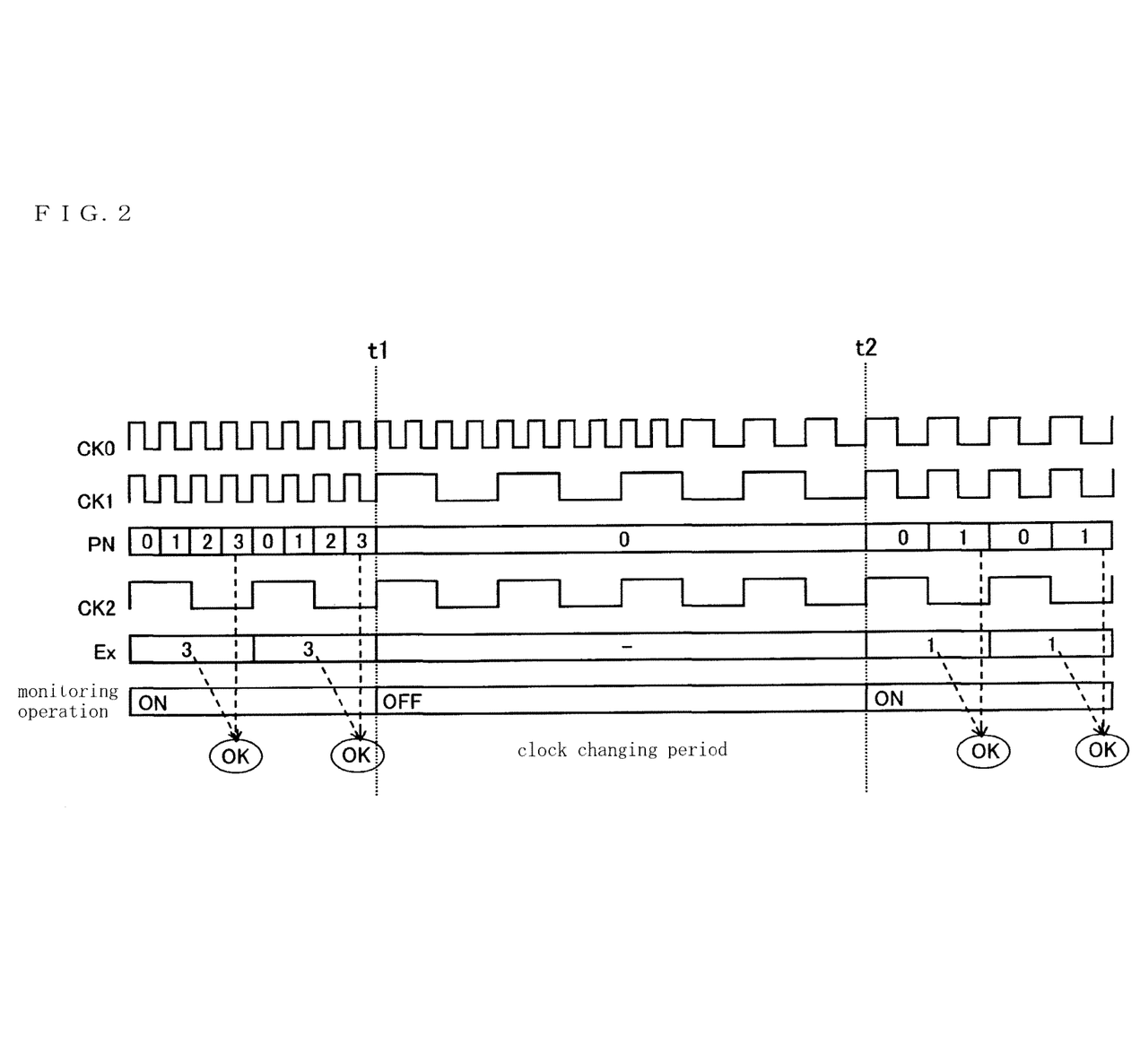
FIG. 2 is a timing chart during a normal operation in the system clock monitoring apparatus according to the exemplary embodiment 1.
Figure 3:
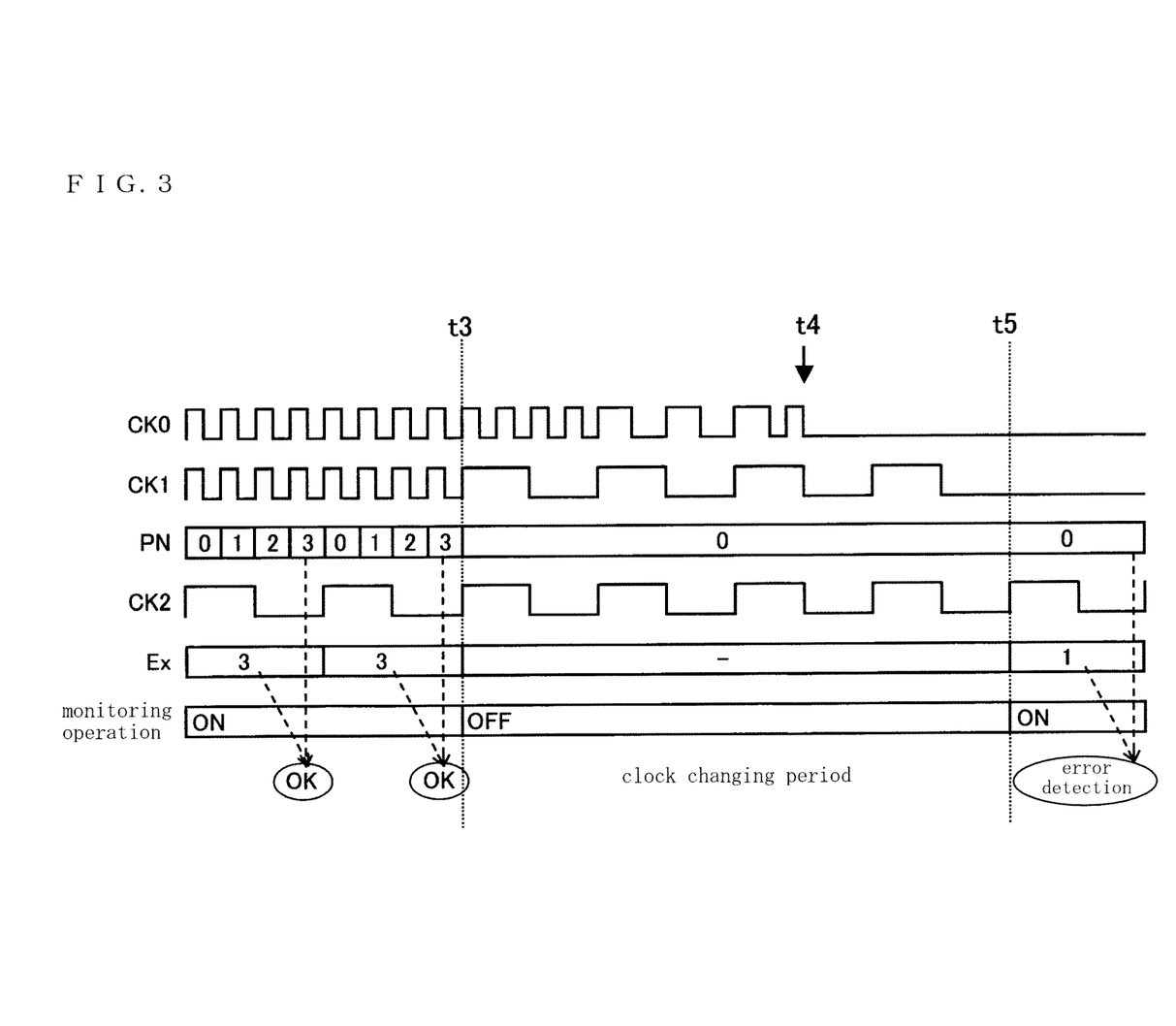
FIG. 3 is a timing chart during an operation where an abnormality is detected in the system clock monitoring apparatus according to the exemplary embodiment 1.

Next, an operation of the electric system 100 (system clock monitoring apparatus) according to the present exemplary embodiment thus configured is described referring to timing charts illustrated in FIGS. 2 and 3.

1) First, a normal operation of the electric system 100 is described referring to FIG. 2. A reference symbol t1 denotes a start timing of a status change associated with a frequency variation of the system control clock CK1, and a reference symbol t2 denotes an end timing of the status change. A period from t1 to t2 is a clock changing period. When the system clock monitoring operation restarts, the counter 12 counts a pulse number PN of the system clock CK0 during one cycle of the monitoring clock CK2. Then, the comparator circuit 14 compares the pulse number PN of the system clock CK0 to an expected value Ex stored in the storage circuit 13 for each cycle of the monitoring clock CK2. It is assumed that three pulses of the system clock CK0 are currently counted during one cycle of the monitoring clock CK2, and the expected value Ex is set to Ex=3. Then, a comparison result, PN (3)=EX (3), is obtained, and the normal operation continues.

When the CPU/peripheral circuit 11 carries out the clock setting or mode change associated with the frequency variation of the system control clock CK1 (timing t1), the mode determination circuit 3 detects the action and requests the clock change circuit 2 to perform the clock change. The clock change circuit 2 thus requested changes the system control clock CK1 from the frequency-variable system clock CK0 to the frequency-stable monitoring clock CK2 of a different source. Based on the mode detection, the mode determination circuit 3 makes the counter 12 suspend the system clock monitoring operation (counting of the pulse number and comparison of the pulse count to the expected value). Though the system clock monitoring operation (counting of the pulse number and comparison of the pulse count to the expected value) is suspended during the clock setting or mode change, oscillation of the monitoring clock CK2 is still ongoing. The CPU/peripheral circuit 11 is operating based on the frequency-stable monitoring clock CK2 selected as the system control clock CK1. Therefore, an operation rate may more or less slow down, but the system clock CK0 whose frequency is currently changing is prevented from adversely affecting the CPU/peripheral circuit 11.

During a short period from the status change start timing t1 to the status change end timing t2 associated with the frequency variation of the system control clock CK1, the system clock monitoring operation, which includes counting of the pulse number of the system clock CK0 and comparison of the pulse count to the expected value, is suspended. During the suspension of the system clock monitoring operation, the monitoring clock CK2 having a stably constant frequency is used as the system control clock CK1 to drive the CPU/peripheral circuit 11.

When the clock setting or mode change is completed (timing t2), the clock change circuit 2 is controlled by the mode determination circuit 3 which detected the completion to change the system control clock CK1 from the monitoring clock CK2 to the frequency-changed system clock CK0. Based on the control by the mode determination circuit 3, the storage circuit 13 updates the expected value Ex to be outputted to an expected value after the clock setting or mode change, and the counter 12 restarts the system clock monitoring operation. It is assumed that the pulse of the system clock CK0 is currently counted once during one cycle of the monitoring clock CK2, and the updated expected value Ex is set to Ex=1. Then, a comparison result, PN (1)=EX (1), is obtained, and the normal operation continues. A software program may be used to change the system control clock CK1 to and from the monitoring clock CK2 and the system clock CK0.

2) An operation in the event that the system clock source accidentally stops during the clock change is described below referring to FIG. 3.

In the event that the system clock source CS unexpectedly stops during the clock setting or mode change (timing t4), the output of the system clock CK0 from the clock generator 1 concurrently stops. Though the system clock monitoring operation is suspended at the time, the CPU/peripheral circuit 11 normally continues its operation because the frequency-stable monitoring clock CK2 of a different source is used as the system control clock CK1 for the operation. When the clock setting or mode change is completed (timing t5), the system control clock CK1 is changed back to the system clock CK0 which already stopped. Then, the system clock monitoring operation restarts. The comparator circuit 14 compares the pulse number PN of the system clock CK0 supplied from the counter 12 to the expected value Ex. Since the system clock CK0 is currently not outputted, the pulse number PN is PN=0. Then, the pulse number PN fails to meet the expected value Ex. The comparator circuit 14 which detected the failure to meet the expected value Ex detects that the system clock CK0 is undergoing an abnormality, and outputs the abnormality detection signal Sa to the CPU/peripheral circuit. The CPU/peripheral circuit 11 which received the abnormality detection signal Sa leads the electric system 100 to a safe condition.

According to the present exemplary embodiment described so far, the system control clock CK1 is changed from the frequency-variable system clock CK0 to the frequency-stable monitoring clock CK2 of a different source when the frequency of the system clock CK0 is intentionally changed for the clock setting or mode change in, for example, an operation mode change or transition to a low power consumption mode. Accordingly, the electric system 100 can constantly monitor the system clock without suspending the oscillation of the monitoring clock CK2. As a result, the clock frequency can be changed without undermining the safety of the electric system.

When the system control clock CK1 is changed to and from the system clock CK0 and the monitoring clock CK2, the clock change circuit 2 is controlled not to generate one of the system clock CK0 and the monitoring clock CK2 having a cycle shorter than the other as the system control clock CK1. As a result, a noise pulse is much less likely to occur in the frequency-changed system control clock CK1, which stabilizes the operation of the CPU/peripheral circuit 11 based on the system control clock CK1.

Exemplary Embodiment 2

Figure 4:
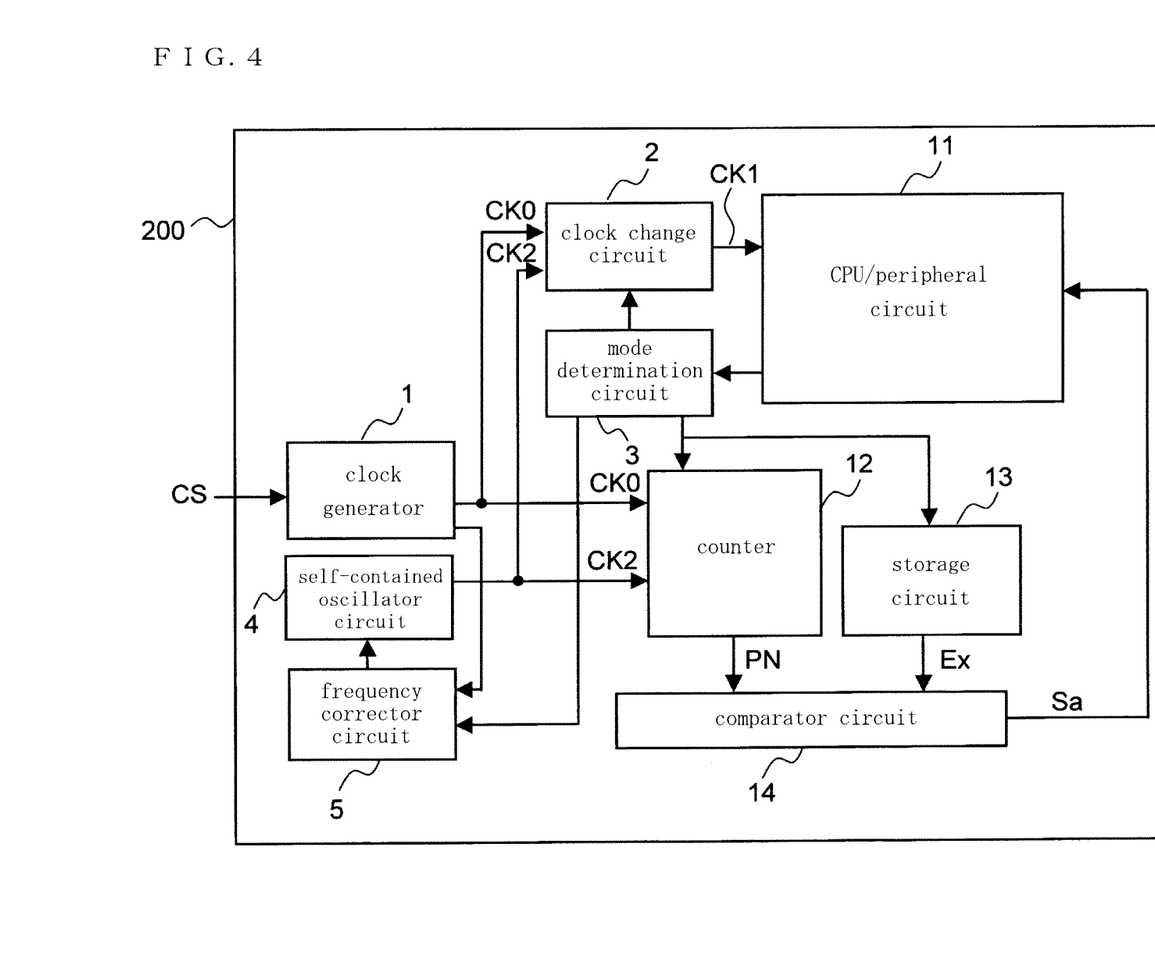
FIG. 4 is a block diagram illustrating a system clock monitoring apparatus according to an exemplary embodiment 2 of the present invention.

FIG. 4 is a block diagram of an electric system 200 loaded with a system clock monitoring apparatus according to an exemplary embodiment 2 of the present invention. Any structural elements of FIG. 4 similar to those illustrated in FIG. 1 according to the exemplary embodiment 1 are illustrated with the same reference symbols. Hereinafter, technical characteristics according to the present exemplary embodiment are described.

The electric system 200 according to the present exemplary embodiment is provided with a self-contained oscillator circuit 4 and a frequency corrector circuit 5 in addition to the structural elements described in the exemplary embodiment 1. The self-contained oscillator circuit 4 generates the monitoring clock CK2 and outputs the generated monitoring clock CK2 to the clock change circuit 2 and the counter 12. The frequency corrector circuit 5 controls the frequency of the monitoring clock CK2 generated by the self-contained oscillator circuit 4 based on a control signal supplied from the clock generator 1 and a control signal supplied from the mode determination circuit 3.

The self-contained oscillator circuit 4 and the frequency corrector circuit 5 are mounted in the electric system 200. In the event of any manufacturing variability, a frequency error occurs in the monitoring clock CK2 generated by the self-contained oscillator circuit 4. To avoid the problem, an offset value in an inspection stage prior to shipping, which is used to even out the frequency of the monitoring clock CK2 generated by the self-contained oscillator circuit 4, is calculated, and then the calculated offset value is stored in the frequency corrector circuit 5. The frequency corrector circuit 5 is configured to make the self-contained oscillator circuit 4 generate the monitoring clock CK2 having a frequency equal to the frequency of the system clock CK0 as long as the mode determination circuit 3 makes the clock change circuit 2 select the monitoring clock CK2 as the system control clock CK1. The rest of the technical characteristics are similar to the exemplary embodiment 1, description of which will be omitted.

Figure 5:
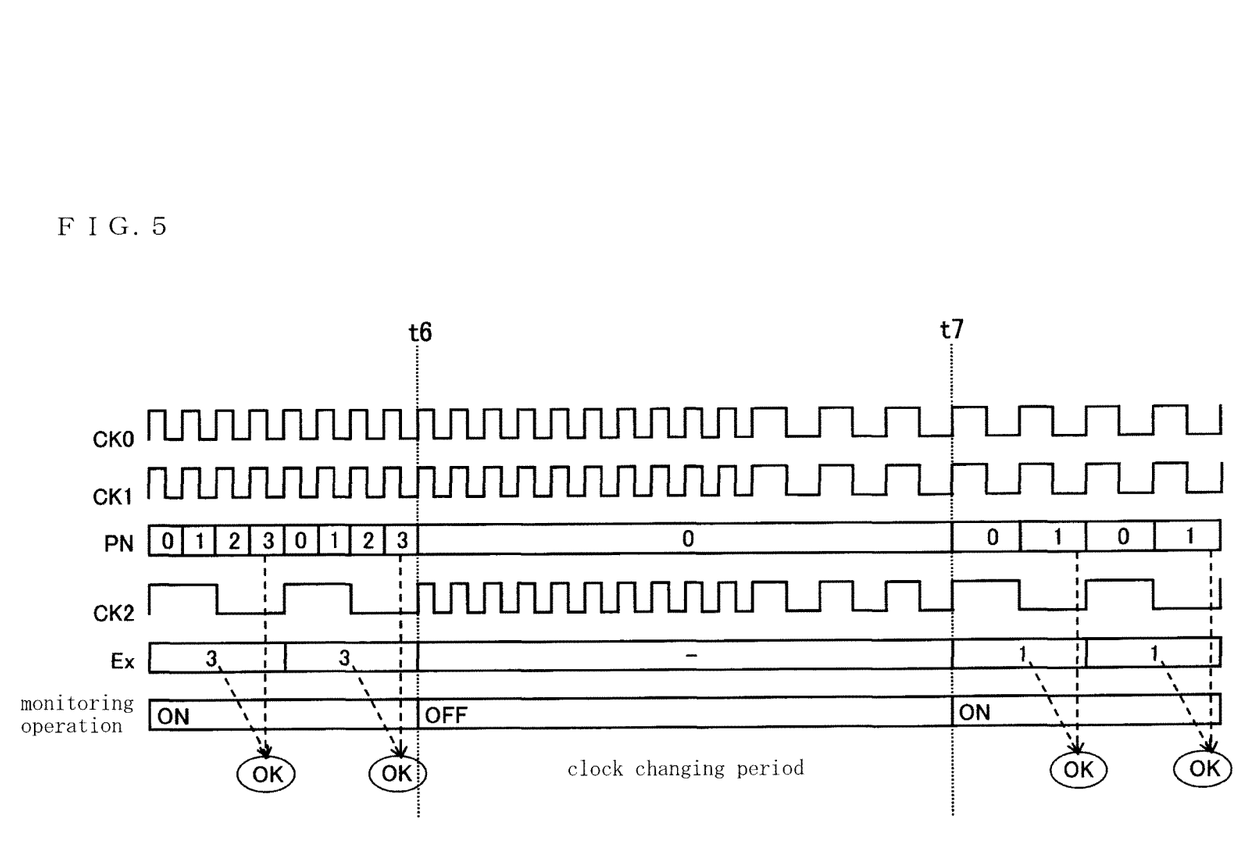
FIG. 5 is a timing chart during a normal operation in the system clock monitoring apparatus according to the exemplary embodiment 2.

An operation of the system clock monitoring apparatus according to the present exemplary embodiment thus technically characterized is described below referring to a timing chart illustrated in FIG. 5. When the system clock monitoring operation restarts, the counter 12 counts the pulse number PN of the system clock CK0 during one cycle of the monitoring clock CK2. Then, the comparator circuit 14 compares the pulse number PN of the system clock CK0 to the expected value Ex stored in the storage circuit 13. The pulse number PN is compared to the expected value by each cycle of the monitoring cycle CK2.

When the CPU/peripheral circuit 11 carries out the clock setting or mode change associated with the frequency variation of the system control clock CK1 (timing t6), the mode determination circuit 3 which detected the action requests the clock change circuit 2 to perform the clock change. Based on the request, the clock change circuit 2 changes the system control clock CK1 from the frequency-variable system clock CK0 to the frequency-stable monitoring clock CK2 of a different source. Based on the mode detection, the mode determination circuit 3 makes the counter 12 suspend the system clock monitoring operation (counting of the pulse number and comparison of the pulse count to the expected value).

When the monitoring clock CK is selected as the system control clock CK1 (timing t6), the frequency corrector circuit 5 requests the self-contained oscillator circuit 4 to perform the frequency change. Requested to perform the frequency change, the self-contained oscillator circuit 4 changes the frequency of the monitoring clock CK2 to be equal to the frequency of the system clock CK0.

During the clock setting or mode change, the system clock monitoring operation (counting of the pulse number and comparison of the pulse count to the expected value) is suspended, while the oscillation of the monitoring clock CK2 continues. Therefore, the CPU/peripheral circuit 11 is operating based on the monitoring clock CK2 selected as the system control clock CK1, thereby preventing the system clock CK0 whose frequency is currently changing from adversely affecting the CPU/peripheral circuit 11. Further, a user needs not be aware that the CPU/peripheral circuit 11 is operating based on the monitoring clock CK2 because the monitoring clock CK2 has the same frequency as the system clock CK0.

When the clock setting or mode change is completed (timing t7), the clock change circuit 2 is controlled by the mode determination circuit 3 which detected the completion to change the system control clock CK1 from the monitoring clock CK2 to the frequency-changed system clock CK0. Based on the control by the mode determination circuit 3, the storage circuit 13 updates the expected value Ex to be outputted to an expected value after the clock setting or mode change, and the counter 12 restarts the system clock monitoring operation. At the time, the frequency corrector circuit 5 makes the self-contained oscillator circuit 4 change the frequency of the monitoring clock CK2 to its original frequency for monitoring the system clock. A software program may be used to change the system control clock CK1 to and from the monitoring clock CK2 and the system clock CK0.

According to the present exemplary embodiment described so far, the monitoring clock CK2 is supplied from the self-contained oscillator circuit 4 loaded in the system 200 to avoid any impacts from external noise, so that the stability of the monitoring clock CK2 is further improved. Because the monitoring clock CK2 having the same frequency as the system clock CK0 is always outputted during the clock change, the CPU/peripheral circuit 11 can be controlled without making a user be aware of the frequency of the monitoring clock CK2. Further, the CPU/peripheral circuit 11 can be driven with a good responsiveness to the frequency change of the system clock.

Exemplary Embodiment 3

Figure 6:
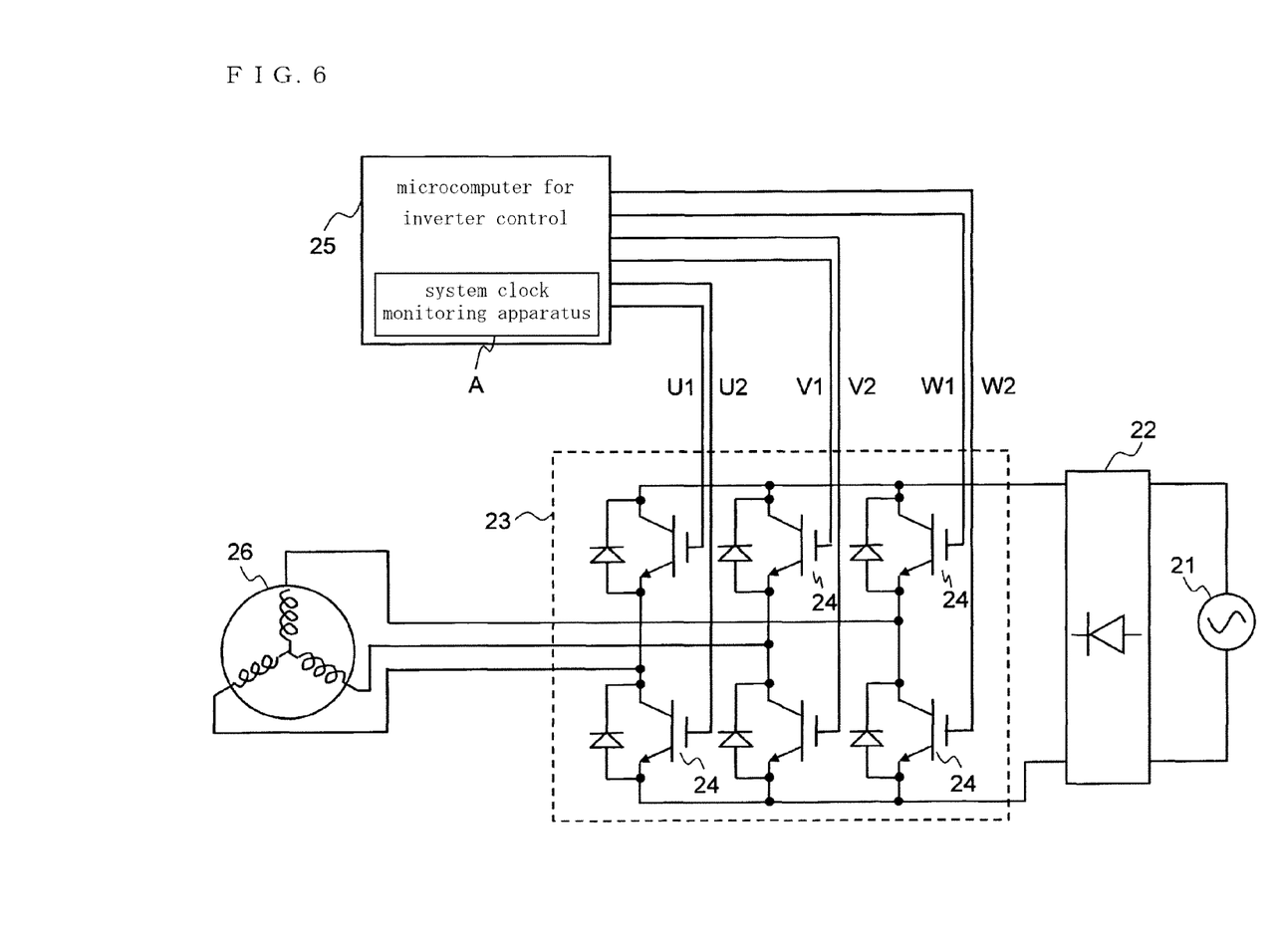
FIG. 6 is a block diagram illustrating a motor control system according to an exemplary embodiment 3 of the present invention.

An exemplary embodiment 3 of the present invention is described below. The present exemplary embodiment relates to a motor control system. FIG. 6 is a block diagram illustrating a motor control system employed in a wide range of industrial applications and also a variety of home electronic appliances. The motor control system according to the present exemplary embodiment has an AC power source 21, a converter circuit 22, an inverter circuit 23, switching elements (IGBT elements) 24 constituting the inverter circuit 23, a microcomputer 25 for inverter control, and a three-phase motor 26.

The microcomputer 25 for inverter control is loaded with a system clock monitoring apparatus A technically characterized as described in the exemplary embodiment 1 or the exemplary embodiment 2. The microcomputer 25 controls the three-phase motor 26. The converter circuit 22 converts an alternate current outputted from the AC power source 21 into a direct current and supplies the direct current to the inverter circuit 23. The microcomputer 25 controls the switching elements 24 of the inverter circuit 23 through six outputs thereof (U-phase outputs (U1 and U2), V-phase outputs (V1 and V2), and W-phase outputs (W1 and W2)). As a result, current supplied to the three-phase motor 26 is controlled to regulate a rotational direction and a rotational speed.

Figure 7:
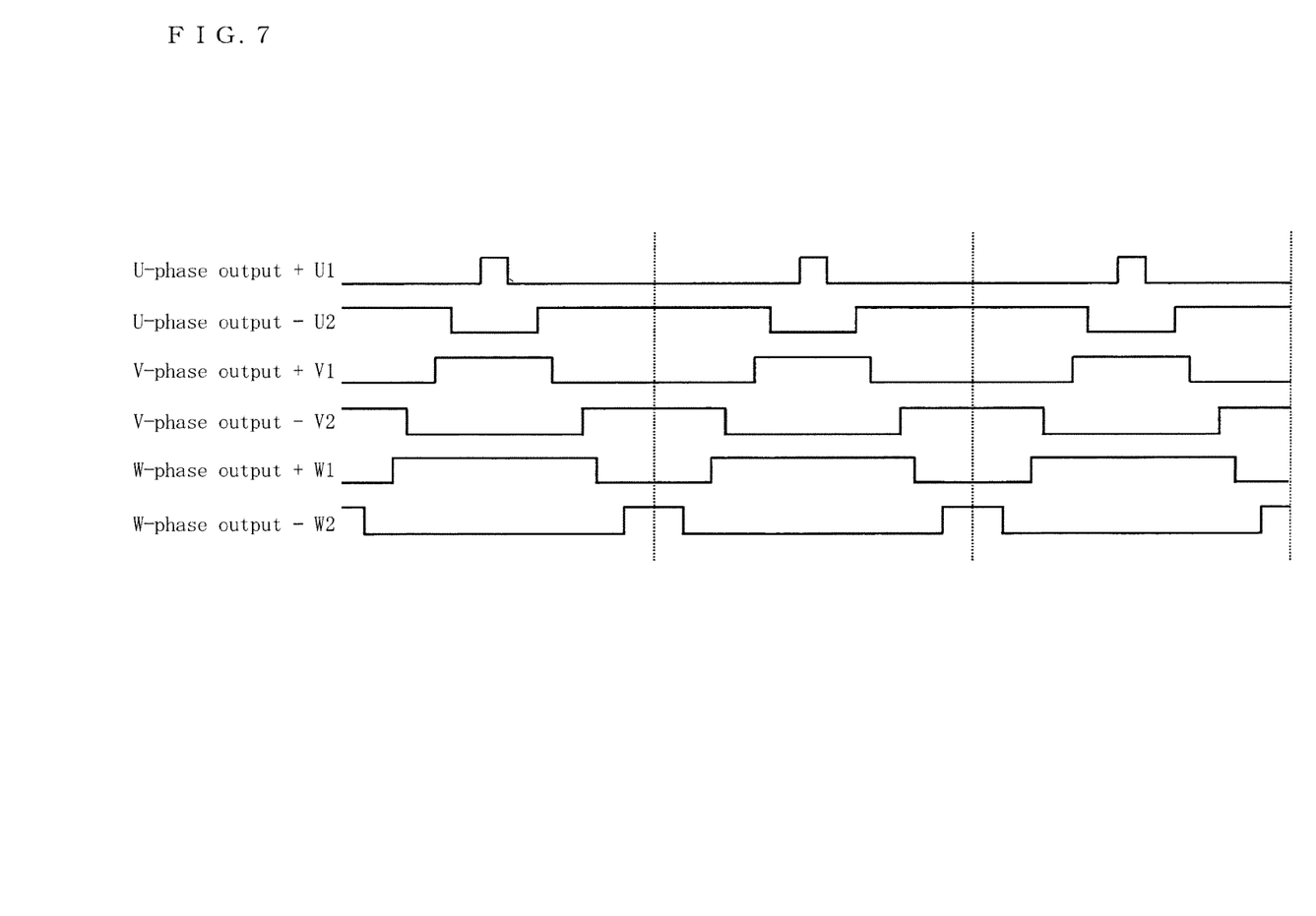
FIG. 7 is a timing chart of motor control terminals in a microcomputer for inverter control according to the exemplary embodiment 3 during a normal operation.

FIG. 7 is a timing chart of the output terminals in the microcomputer 25 for inverter control during a normal operation. The U-phase outputs (U1 and U2), V-phase outputs (V1 and V2), and W-phase outputs (VV1 and W2) are respectively paired with each other. The microcomputer 25 controls the operation so that the switching elements 24 on plus and minus sides are not both active (control signal at H) because a through current flow runs through the whole system if the plus and minus switching elements 24 are all active, possibly destroying the electric system.

Figure 8:
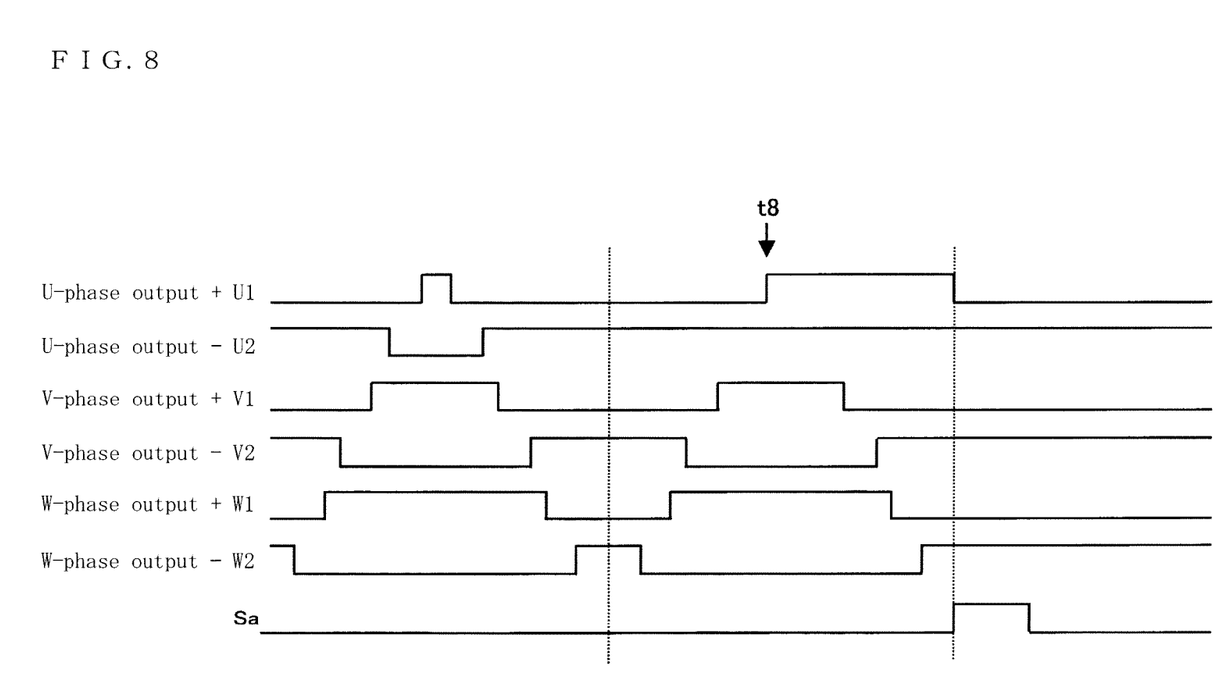
FIG. 8 is a timing chart of the motor control terminals in the microcomputer for inverter control according to the exemplary embodiment 3 during an operation where an abnormality is detected.

FIG. 8 is a timing chart of the output terminals in the microcomputer 25 for inverter control and the operation of the abnormality detection signal Sa. In the case where the clock frequency undergoes an abnormality, thereby generating an abnormality in the command control of the microcomputer 25 and making the U-phase outputs (U1 and U2) both active during any interval (timing t8), a through current is generated. However, the system clock monitoring apparatus A of the microcomputer 25 detects the abnormality of the frequency of the system clock CK0, and outputs the abnormality detection signal Sa to the CPU/peripheral circuit 11. The CPU/peripheral circuit 11 which received the abnormality detection signal Sa mandatorily leads the six outputs of the microcomputer 25 to a safe condition, so that generation of the through current is avoided.

According to the present exemplary embodiment described so far, the system clock monitoring apparatus can be effectively used in the electric system wherein the three-phase motor is inverter-controlled.

INDUSTRIAL APPLICABILITY

The system clock monitoring apparatus according to the present invention is configured to constantly monitor a system clock which is an essential element of a system. The system clock monitoring apparatus thus technically advantageous is widely applicable to any fields where an emphasis is placed on the safety of semiconductor products.

DESCRIPTION OF REFERENCE SYMBOLS 1 clock generator
2 clock change circuit
3 mode determination circuit
4 self-contained oscillator circuit
5 frequency corrector circuit 11 CPU/peripheral circuit
12 counter circuit
13 storage circuit
14 comparator circuit
21 AC power source
22 converter circuit
23 inverter circuit
24 switching element
25 microcomputer for inverter control
26 three-phase motor
100, 200 system loaded with system clock monitoring apparatus
A system clock monitoring apparatus
CS system clock source
CK0 system clock
CK1 system control clock
CK2 monitoring clock
PN pulse number of system clock
Ex expected value for pulse number of system clock
Sa abnormality detection signal
U1 U-phase output +
U2 U-phase output −
V1 V-phase output +
V2 V-phase output −
W1 W-phase output +
W2 W-phase output −

The invention claimed is:

1. A system clock monitoring apparatus loaded in an electric system driven by a system control clock based on a system clock, the system clock monitoring apparatus being configured to monitor a frequency abnormality of the system clock using a monitoring clock supplied from a source different to the system clock, comprising:
   a mode determination circuit configured to determine whether there is a status change of the electric system associated with a frequency variation of the system control clock, the status change is performed by a CPU/Peripheral circuit; and
   a clock change circuit configured to change the system control clock from the system clock to the monitoring clock based on a determination result obtained by the mode determination circuit, wherein the mode determination circuit is configured to make the clock change circuit change the system control clock from the system clock to the monitoring clock when the status change is detected and then suspend a system clock monitoring operation by the system clock monitoring apparatus during at least a period from a start timing of the status change to an end timing of the status change, and the mode determination circuit is configured to make the clock change circuit change the system control clock from the monitoring clock to a frequency-changed system clock when the end timing arrives and then restarts the system clock monitoring operation.

2. The system clock monitoring apparatus as claimed in claim 1, wherein the clock change circuit is under a synchronous control such that any system control clock having a cycle shorter than one of cycles of the system clock and the monitoring clock is not generated when the system control clock is changed from the system clock to the monitoring clock and from the monitoring clock to the system clock.

3. The system clock monitoring apparatus as claimed in claim 2, wherein the clock change circuit starts to change the system control clock when a frequency of the system clock or a frequency of the monitoring clock is in a high mode.

4. The system clock monitoring apparatus as claimed in claim 1, further comprising:
   a self-contained oscillator circuit configured to generate the monitoring clock; and
   a frequency corrector circuit configured to control a frequency of the monitoring clock generated by the self-contained oscillator circuit.

5. The system clock monitoring apparatus as claimed in claim 4, wherein the frequency corrector circuit makes the self-contained oscillator circuit output the monitoring clock having a frequency equal to the frequency of the system clock when the clock change circuit is currently selecting the monitoring clock.

6. The system clock monitoring apparatus as claimed in claim 1, wherein the clock change circuit is configured to change the system control clock from the system clock to the monitoring clock and from the monitoring clock to the system clock using software.

7. A motor control system, comprising:
   a motor;
   an inverter apparatus configured to control number of rotations of the motor based on a system control clock; and
   a microcomputer configured to control the inverter apparatus, wherein the microcomputer includes the system clock monitoring apparatus as claimed in claim 1 configured to monitor the frequency abnormality of the system clock using the monitoring clock supplied from the source different to the system clock, so that the motor is led to a safe condition by monitoring the frequency abnormality of the system clock in the system clock monitoring apparatus.

8. The system clock monitoring apparatus as claimed in claim 1, wherein the status change performed by the CPU/Peripheral circuit includes a transition to a lower power consumption mode.

9. The system clock monitoring apparatus as claimed in claim 1, wherein the status change performed by the CPU/Peripheral circuit includes an operation mode change.

* * * * *